(12) United States Patent
Mueller et al.

(10) Patent No.: US 9,222,298 B2
(45) Date of Patent: Dec. 29, 2015

(54) INSULATING GLAZING WITH ELECTRICAL CONNECTION ELEMENT

(75) Inventors: Marco Mueller, Waldfeucht (DE); Karl-Heinz Paffen, Herzogenrath (DE); Rino Messere, Modave (BE); Manfred Gillissen, Herzogenrath (DE); Andreas Kleinke, Kierspe (DE); Andre Grote, Radevormwald (DE); Markus Hoppe, Hagen (DE)

(73) Assignee: SAINT-GOBAIN GLASS FRANCE, Courbevoie (FR)

(*) Notice: Subject to any disclaimer, the term of this patent is extended or adjusted under 35 U.S.C. 154(b) by 141 days.

(21) Appl. No.: 14/122,636

(22) PCT Filed: Jun. 6, 2012

(86) PCT No.: PCT/EP2012/060758
§ 371 (c)(1),
(2), (4) Date: Nov. 26, 2013

(87) PCT Pub. No.: WO2012/171844
PCT Pub. Date: Dec. 20, 2012

(65) Prior Publication Data
US 2014/0099826 A1  Apr. 10, 2014

(30) Foreign Application Priority Data
Jun. 14, 2011  (EP) .................................. 11169821

(51) Int. Cl.
*E06B 3/663* (2006.01)
*F21V 23/06* (2006.01)
(Continued)

(52) U.S. Cl.
CPC ............. *E06B 3/66309* (2013.01); *E06B 3/667* (2013.01); *F21V 23/06* (2013.01);
(Continued)

(58) Field of Classification Search
CPC . E06B 3/66309; E06B 3/66376; E06B 3/667; H02S 40/34; H01L 31/02008; A47F 11/10; F21V 23/06; F21V 33/0016
See application file for complete search history.

(56) References Cited

U.S. PATENT DOCUMENTS 6,148,563 A * 11/2000 Roche et al. .................... 49/501
6,185,883 B1   2/2001 Howard
(Continued)

FOREIGN PATENT DOCUMENTS

DE   102005036869   2/2007
DE   102005050545   5/2007
(Continued)

OTHER PUBLICATIONS

PCT Written Opinion mailed on Jul. 10, 2012 for PCT Application PCT/EP2012/060758 filed on Jun. 6, 2012 in the name of Saint Gobain Glass France (German with English translation).
(Continued)

*Primary Examiner* — Alan Cariaso
(74) *Attorney, Agent, or Firm* — Steinfl & Bruno LLP

(57) ABSTRACT

An insulating glazing with an electrical connection element is described. The insulating glazing having a first pane, and a second pane, a peripheral spacer between the first pane and the second pane, an inner insulation between the peripheral spacer and the first pane and between the peripheral spacer and the second pane, an outer insulation in an outer edge space between the first pane, the peripheral spacer, and the second pane, and a connected plug connection arrangement that has an inner plug connection between the first pane and the second pane, a central plug connection in the peripheral spacer, and an outer plug connection.

18 Claims, 6 Drawing Sheets

Figure 1A:
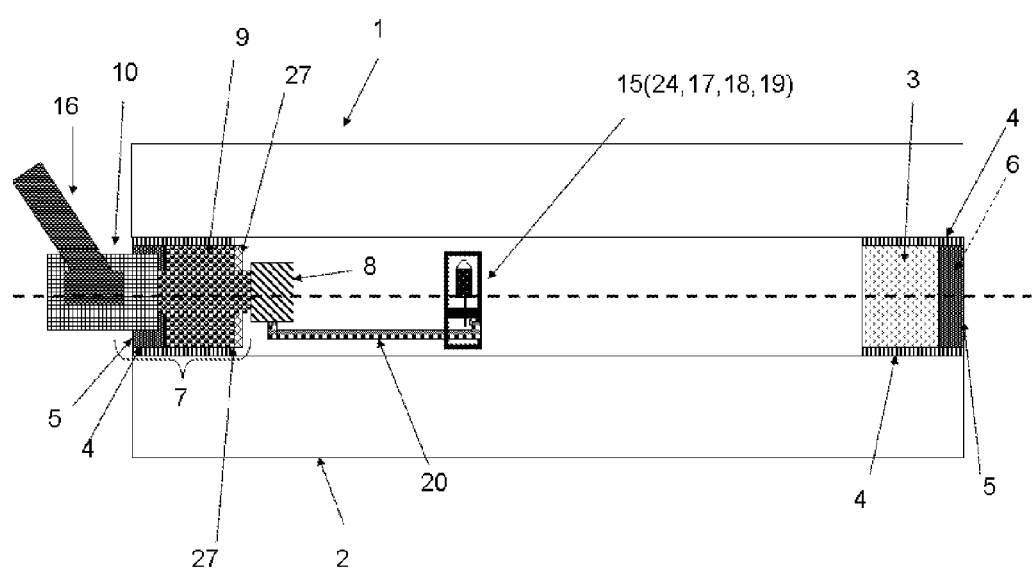

(51) Int. Cl.
 *E06B 3/667* (2006.01)
 *H01L 31/02* (2006.01)
 *H02S 40/34* (2014.01)
 *F21V 33/00* (2006.01)

(52) U.S. Cl.
 CPC .......... *H01L31/02008* (2013.01); *H02S 40/34* (2014.12); *E06B 3/66376* (2013.01); *F21V 33/0016* (2013.01)

(56) References Cited

U.S. PATENT DOCUMENTS

| | | | |
|---|---|---|---|
| 6,277,523 B1 | | 8/2001 | Giron |
| 8,375,657 B2 * | | 2/2013 | Buchwald et al. ....... 52/204.593 |
| 8,656,661 B2 * | | 2/2014 | Sagdic et al. ................ 52/173.3 |
| 2004/0031234 A1 * | | 2/2004 | Emde .......................... 52/786.11 |
| 2004/0040228 A1 | | 3/2004 | Emde et al. |
| 2012/0274189 A1 * | | 11/2012 | Attey et al. .................. 312/114 |

FOREIGN PATENT DOCUMENTS

| | | | |
|---|---|---|---|
| DE | 102005061855 | 7/2007 | |
| EP | 1346178 | 11/2004 | |
| EP | 1529922 | 5/2005 | |
| EP | 1655442 | 5/2006 | |
| EP | 2186986 A2 * | 5/2010 | ............... E06B 3/67 |
| WO | 00/58580 | 10/2000 | |
| WO | 2011/046512 | 4/2011 | |

OTHER PUBLICATIONS

PCT International Search Report mailed on Jul. 10, 2012 for PCT Application PCT/EP2012/060758 filed on Jun. 6, 2012 in the name of Saint Gobain Glass France.

* cited by examiner

INSULATING GLAZING WITH ELECTRICAL CONNECTION ELEMENT

CROSS REFERENCE TO RELATED APPLICATIONS

The present application is the US national stage of International Patent Application PCT/EP2012/060758 filed on Jun. 6, 2012 which, in turn, claims priority to European Patent Application EP 11169821.3 filed on Jun. 14, 2011.

The invention comprises an insulating glazing with an electrical connection element, a method for its production, and its use.

It is no longer possible to imagine modern buildings without insulating glazing; they constitute an increasingly large part of the outward directed glazings. Insulating glazings usually include at least two panes of glass or polymer materials. The panes are separated from each other by a gas or vacuum space defined by a spacer. The thermal insulating capability of insulating glass is clearly higher than single-pane glass and can be even further increased and improved in triple-pane glazings or with special coatings. In addition to the important property of thermal insulation, optical and aesthetic characteristics increasingly play an important role in the building glazing sector. Illuminated pane arrangements are an example of this. These comprise panes and illumination means installed on the edge or in the panes. Reflection elements applied on the pane surface enable illumination of the pane area. Interior areas and also external façades of buildings can thus be very uniformly illuminated. Illuminated pane arrangements are found in a large number of fields of application inside and outside of buildings and motor vehicles. In contrast to a punctiform light source, such as a floor lamp or a ceiling light, a very uniform, area-wise light can be produced by an illuminated pane arrangement. Depending on the light source used and the activation electronics, different light effects can even be realized. In particular, with the use of colored LEDs, different color effects can be combined. Thus, moving light effects can be generated through targeted activation and extinguishing of individual LEDs. For the observer, the light seems to spread out in waves of color. If multiple waves of color overlay each other, further effects such as a colored so-called moiré effect are produced. These light and color effects can also be used for advertising spaces or to generate artistic and architectonic effects.

Insulating glazings with electrochromic coating constitute another example. The electrochromic coating enables, through application of an electrical voltage, immediately changing the transmission of a pane. Thus, it is possible to alter the amount of incident light in a building very quickly and flexibly. The electrodes can be implemented as cathodes, for instance, tungsten oxide $WO_3$, or as anodes, for example, nickel oxides $NiO_xH_y$, $NiO_x$, or iridium oxides $IrO_x$. The sequence is variable. The electrolyte includes at least one electrically insulating layer, for example, hydrogenated tantalum oxide $Ta_2O_5*nH_2O$, antimony oxide $Sb_2O_3$, zirconium dioxide $ZrO_2$, and/or titanium dioxide $TiO_2$. The inhibited electrochromic layer contains, for example, hydrogenated tungsten oxide $WO_3*nH_2O$, niobium oxide $Nb_2O_3$, $Nb_2O_3*nH_2O$, tin oxide $SnO_2$, $SnO_2*nH_2O$, and/or bismuth oxide $Bi_2O_3$, $Bi_2O_3*nH_2O$. Even a three-part sandwich-like layer structure is possible, such as, for example, $Ta_2O_5*nH_2O/WO_3*nH_2O/Ta_2O_5*nH_2O$. Examples of such electrochromic coatings are disclosed in U.S. Pat. No. 6,277,523 B1. The electrochromic coating is enclosed by the substrate surface. It can be either the outer pane or inner pane. By application of a voltage, it is then possible, as mentioned, to reversibly reduce the transmission of the pane.

Both illuminated pane arrangements and electrochromic glazings require an external voltage supply and corresponding connections and cables. However, especially cables make automated and machine-based manufacture of insulated glazings more difficult. In addition, cables hanging out can be damaged during production, stacking, storage, or transport. These cable breaks then require, in many cases, replacement of the entire insulating glazing. In addition, cable connection parts reduce long-term gas tightness.

U.S. Pat. No. 6,277,523 B1 describes the construction and function of an electrochromic coating. There, the transparency to light of various wavelengths can be controlled and regulated by applying an electrical charge.

U.S. Pat. No. 6,185,883 B1 discloses a window with decorative elements. The window frame comprises a triple-pane insulating glazing with decorative elements in the middle pane.

EP 1 346 178 B1 discloses a sandwich-like panel element. The two panels are largely transparent. Solar cell elements are installed in the space between the panels or on the panels. A light source is arranged in the front part of at least one panel and enables additional illumination.

DE 10 2005 061 855 A1 discloses a glass element as part of a façade with a long afterglow effect. The long afterglow element comprises a long afterglow pigment in a matrix.

DE 10 2005 036 869 A1 discloses a multilayer composite structure for covering interiors or exteriors of buildings or parts of buildings. The composite structure comprises at least one transparent rigid layer, a plurality of light conductive fibers, and one or a plurality of connectors for connection of the light conductive fibers to a light source.

DE 10 2005 050 545 A1 discloses a contact element for a load arranged between two glass panels, for example, a liquid crystal film. This is connected to a contact pin extending into the space between the panels, which is connected to a plastic housing arranged on the panel edge by an electrically conductive means.

The object of the invention consists in providing an insulating glazing with electrical connections in the interior that can be transported and stored without cables hanging out.

A method for producing the insulating glazing and the use according to the invention of the insulating glazing emerge from other independent claims.

The insulating glazing with an electrical connection element according to the invention comprises a first pane and a second pane. The two panes are separated by a peripheral spacer between the first pane and the second pane. The cavities of the spacers preferably contain a desiccant, particularly preferably silica gel, $CaCl_2$, $Na_2SO_4$, activated carbon, silicates, bentonites, zeolites, and/or mixtures thereof. The desiccants are preferably arranged such that a gas and moisture exchange with the atmosphere in the interior of the insulating glazing is possible, but the materials cannot fly about and are fixed. This can preferably be accomplished by enclosing the desiccant in an air- and moisture-permeable polymer film or in a fine-meshed net. In order to be able to fully exploit energy savings capabilities, the insulating glazing can be filled with a noble gas, preferably argon or krypton, which reduce [sic] the thermal transmittance in the space between the insulating glazings.

The first pane and the second pane preferably have the same dimensions and thicknesses. The panes preferably have an optical transparency of >85%. The pane preferably contains glass and/or polymers, preferably flat glass, float glass, quartz glass, borosilicate glass, soda lime glass, polymethyl methacrylate, and/or mixtures thereof. In an alternative embodiment, the first pane or the second pane can be implemented as a composite glass pane. The insulating glazing according to the invention constitutes, in this case, a triple-pane glazing. An inner insulation is arranged between the spacer and the outer pane as well as the inner pane. An outer insulation is situated in an edge space between the first pane, the second pane, and the spacer. The inner insulation and/or outer insulation preferably contain polymers or silane-modified polymers, particularly preferably organic polysulfides, silicones, RTV (room temperature vulcanizing) silicone rubber, HTV (high temperature vulcanizing) silicone rubber, peroxide vulcanizing silicone rubber, and/or addition vulcanizing silicone rubber, polyurethanes, butyl rubber, and/or polyacrylates. A connected plug connection arrangement is partially integrated into the spacer. The plug connection arrangement comprises an inner plug connection between the first pane and the second pane, a central plug connection in the spacer, and an outer plug connection outside the insulating glazing. The central plug connection comprises a left-hand latching means, a central part with an electrically continuous contact element, and a right-hand latching means. The contact element constitutes a subregion or a projection and/or inset of the central part, which makes the electrical (and mechanical) connection to the inner plug connection as well as the outer plug connection. The electrical contacting with the inner plug connection and outer plug connection takes place preferably by continuous electric plug contacts inside the contact element. The central plug connection arrangement constitutes a part of the spacer or a central part that can be integrated into the spacer, preferably a outwardly and inwardly enclosed part of the spacer. The left-hand latching means and the right-hand latching means enable insertion of the central plug connection arrangement into the spacer and are preferably surrounded by an adhesive, such as acrylate adhesives, methyl methacrylate adhesives, cyanoacrylate adhesives, polyepoxies, silicone adhesives, and/or silane-crosslinking polymer adhesives as well as mixtures and/or copolymers thereof or a sealant. In the context of the invention, the term "latching" also includes smooth or toothless mechanical plugs that enable a connection to or into the spacer. The inner plug connection, the central plug connection, and/or the outer plug connection preferably include polymers and/or metals. The central plug connection is configured such that the space between the panes is sealed preferably gastight. This can be accomplished by applying a metal foil or a metal coating such that the fill gas cannot escape so quickly and, at the same time, no moisture can penetrate. This moisture could otherwise result in fogging of the panes or even in a short circuit on the electrical contacts.

The contact element preferably has 1 to 12 electrical plug contacts, particularly preferably 4 to 10 electrical plug contacts. In the context of the invention, contact elements include plug contacts with male or female terminals. The connection can be made preferably by soldering or by insulation displacement contacts.

The central plug connection preferably has a length of 60 mm to 200 mm, particularly preferably 80 mm to 150 mm.

The central plug connection preferably has a width of 8 mm to 20 mm, preferably of 10 mm to 15 mm. The dimensions can vary corresponding to the dimensions of the insulating glazing.

The left-hand latching means and/or the right-hand latching means are preferably surrounded by an adhesive bond. The adhesive bond ensures a secure hold of the latching means inside the spacer. The latching means also serves for storage of sealant, preferably a butyl rubber or a silane-modified polymer. The sealant permits a moisture and gas tight sealing of the latching means. In addition, the sealant enables compensation between temperature-induced and mechanical stresses within the spacer.

The inner plug connection, the central plug connection, and/or outer plug connection preferably include plugs, jacks, coupling, or sockets. These plug connections enable a secure and simultaneously reversibly releasable connection of the individual plug connections.

The contact element preferably includes a projection, preferably in the direction of the outer plug connection. The projection enables overmolding and the further sealing of the central plug connector with the outer insulation. The projection preferably has a depth of 15 mm to 30 mm. The projection can be removed after the final installation of the central plug connector in the spacer. Alternatively, a closed projection can prevent fouling of the contact element up to the final installation of the plug connection.

The left-hand latching means and/or the right-hand latching means preferably include barbed hooks or splayed arms. These enable a stable and slip-free fastening in the spacer and prevent loosening of the latching means within the spacer.

The plug contacts and/or contact preferably contain silver, copper, tin, gold, aluminum, iron, titanium, tungsten, chromium, and/or alloys thereof and/or a conductive organic polymer.

The outer plug connection preferably has an angled cable feed. The angled cable feed enables space-saving installation of the outer electronics protruding from the insulating glazing. The angled cable feed clearly reduces the size and extent of the cable and electronic cladding mounted on the insulating glazing.

An LED strip is preferably arranged between the first pane and the second pane. The LEDs preferably include LEDs (light emitting diodes) and/or OLEDs (organic light emitting diodes). The LED strip is electrically connected to the inner plug connection. The LED strip includes at least one LED, an LED circuit board (PCB, printed circuit board) fastened to the LED, and an electrical connector fastened on the LED circuit board. The LED circuit board includes commercially available circuit boards and/or boards. These are made of electrically insulating materials on which electrical connections are mounted. Examples of insulating materials are nonconductive polymers such as epoxy-resin-impregnated glass fibers, Teflon, ceramic, and/or polyester film. The electrical connections, for example, conducting wires, contain preferably copper, iron, tin, nickel, gold, silver, and/or alloys thereof. The LEDs are fastened to the LED circuit boards and make contact via the electrical connections. The electrical connector produces, through the arrangement of inner plug connection, a central plug connection, and an outer plug connection, the connection to the power source. Preferably, a control device is also arranged between the electrical connector of the outer plug connection and the power source. This control device enables targeted illumination of individual LEDs. Through the arrangement of different colored LEDs on the LED circuit board, colored light effects can be generated.

The first pane and/or second pane preferably have an electrochromic coating. The electrochromic coating is electrically connected to the inner plug connection.

The first pane and/or second pane preferably have a photovoltaic module or a photovoltaic coating auf. The photovoltaic module or the photovoltaic coating are electrically connected to the inner plug connection.

The invention further comprises a method for producing an insulating glazing with an electrical connection element. In a first step, an electrical load is arranged on a first pane of the subsequent insulating glazing. Next, or previously, a central plug connection is set in a peripheral spacer. In the following step, the electrical load is electrically conductively connected via an inner plug connection to the central connection. In the next step, the spacer is arranged with a shielding inner insulation between the first pane and a second pane and combined with an outer insulation to form an insulating glazing. Before the application of the outer insulation, a protective cap is preferably set on the central plug connection on the outward facing side. After the curing of the outer insulation, this protective cap can be removed. Finally, the central plug connection is connected to an outer plug connection.

The invention further comprises the use of the insulating glazing as illuminated glazing, electrochromic glazing, and/or a photovoltaic module.

Figure 1B:
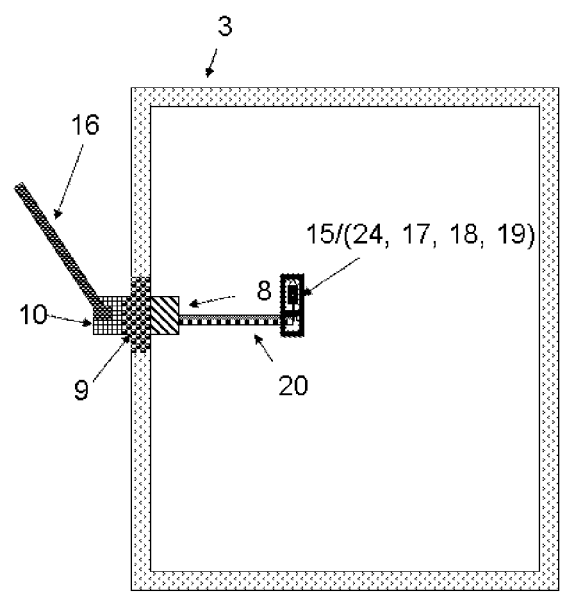
Figure 2:
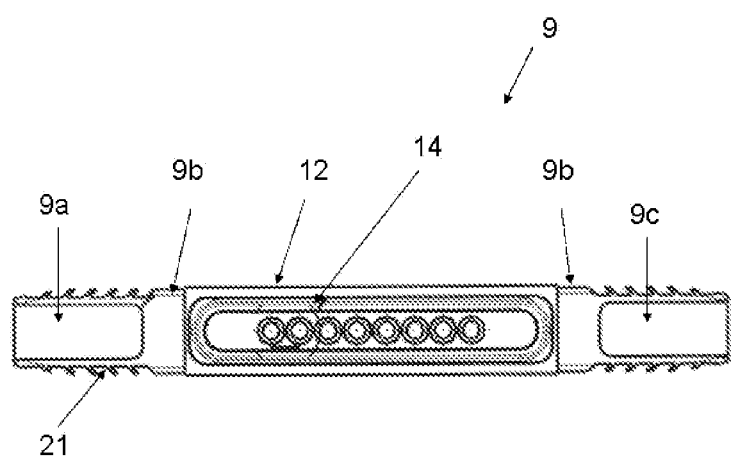
Figure 3:
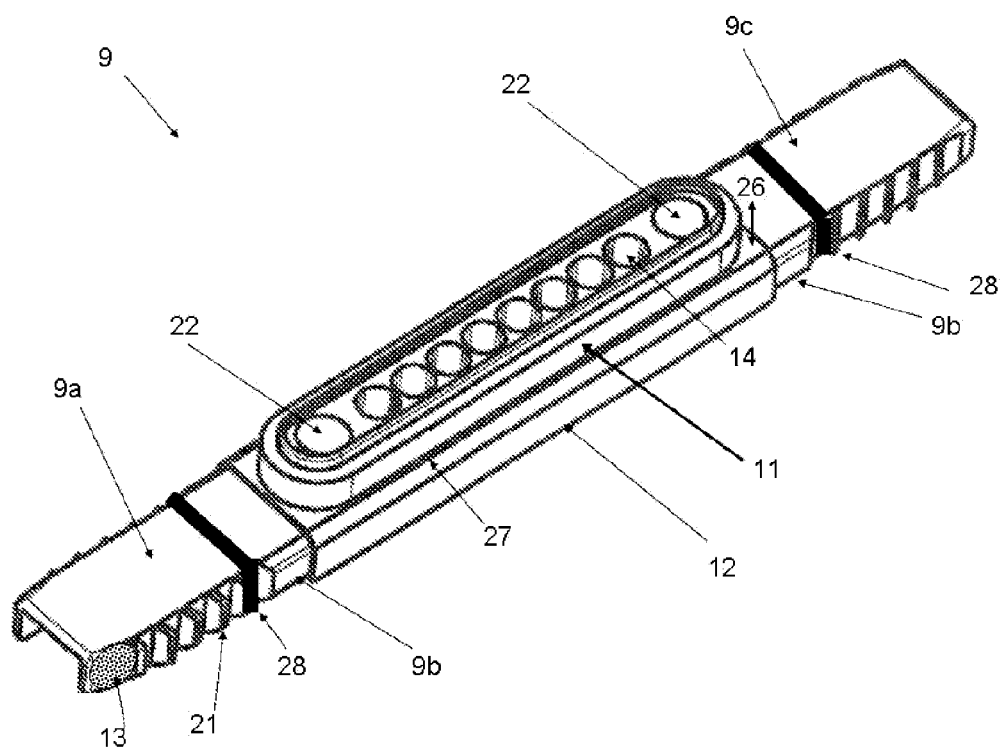
Figure 4:
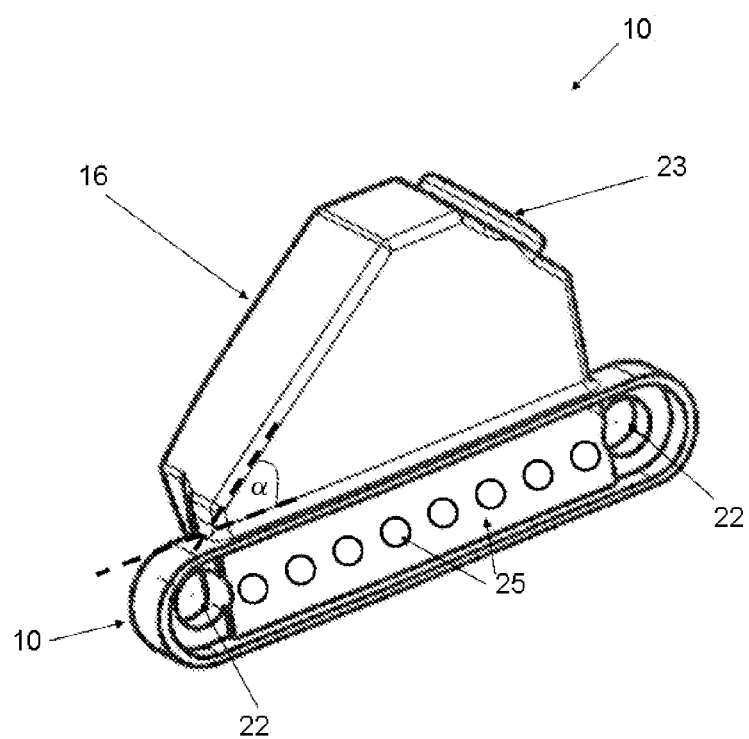
Figure 5:
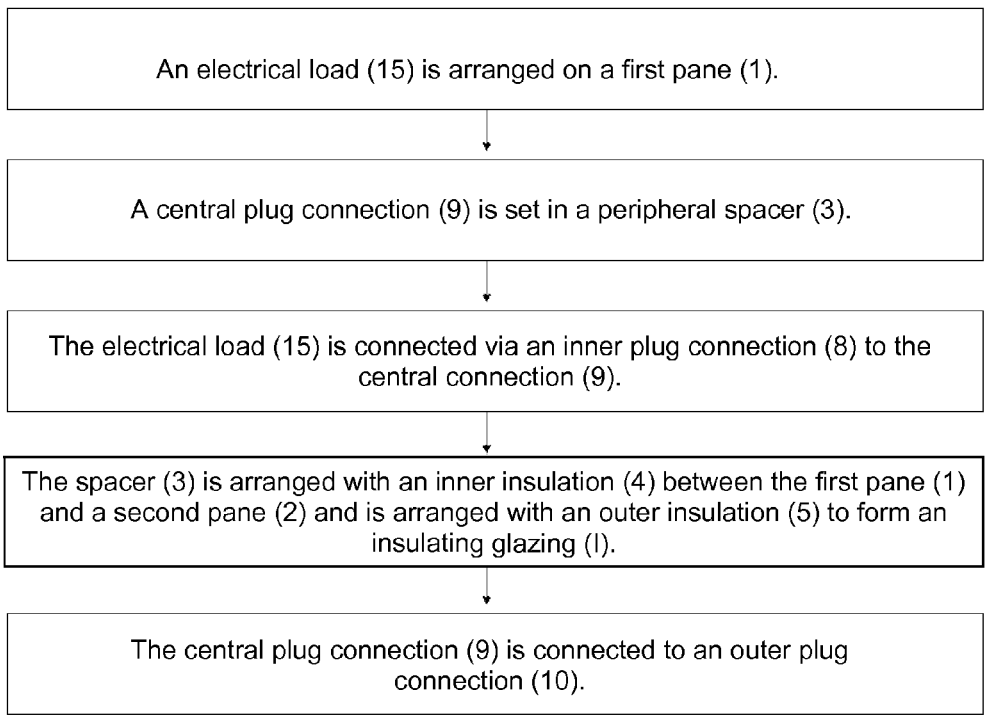

In the following, the invention is explained in detail with reference to drawings. The drawings are a purely schematic representation and not true to scale. They in no way restrict the invention. The drawings include:

FIG. 1a a cross-section of the insulating glazing with an electrical connection element, FIG. 1b a plan view of the spacer and the electrical connection elements, FIG. 2 a plan view of the central plug connection, FIG. 3 an enlarged plan view of the central plug connection, FIG. 4 a plan view of the outer plug connection, and FIG. 5 a flowchart of the method according to the invention.

FIG. 1a depicts a cross-section of the insulating glazing with an electrical plug connection arrangement (7). The dashed line indicates the imaginary central horizontal axis. A first pane (1), second pane (2), spacer (3), and outer insulation (5) constitute the basic structure of the insulating glazing. A central plug connection (9) integrated into the spacer (3) can be contacted from inside the insulating glazing by an inner plug connection (8) and from outside the insulating glazing by an outer plug connection (10). The central plug connection (9) preferably has, on the side facing the interior of the insulating glazing, a metal surface or coating (27). The metal surface or coating (27) additionally seals the interior of the insulating glazing in the region of the central plug connection (9). The spacer (3) is surrounded on the contact surface with the first pane (1) and second pane (2) by an inner insulation (4). The inner insulation (4) can optionally reach to or into the outer insulation (5). The inner insulation (4) seals the contact surface of the spacer (3) with the first pane (1) and second pane (2) moisture and gas tight. The outer insulation (5) completely fills the outer edge space (6, dashed arrow) between the first pane (1), spacer (3), and second pane (2). The inner plug connection (8) enables, via a cable (20), the electrical contacting of an electrical load (15), for example, an LED strip (24), an electrochromic coating (17), a photovoltaic module (18), or a photovoltaic coating (19). The inner plug connection (8) is supplied with current via the arrangement consisting of the angled cable feed (16), outer plug connection (10), and central plug connection (9). The angled cable feed (16) clearly reduces the size and extent of the cable and electronic cladding (not shown) mounted on the insulating glazing. Preferably, a control device (not shown) is also arranged between the outer plug connection (10) as well as the arrangement consisting of the angled cable feed (16) and the power source. This control device enables the targeted illumination of individual LEDs. Through the arrangement of different colored LEDs on the LED circuit board, colored light effects can be generated.

FIG. 1b depicts a plan view of the spacer (3) and the electrical connection elements outer plug connection (10), central plug connection (9), and inner plug connection (8) along the imaginary central horizontal axis (dashed line) in FIG. 1. The spacer (3) is arranged in the form of a frame sandwich-like between the first pane (1) (not shown) and second pane (2) as well as the inner insulation (4) and outer insulation (5). The inner plug connection (8) is supplied with current via the arrangement consisting of the central plug connection (9), outer plug connection (10), and angled cable feed (16). A cable (20) supplies the electrical load (15) and, with it, for example, alternatively, an LED strip (24), an electrochromic coating (17), a photovoltaic module (18), or a photovoltaic coating (19), with electrical voltage.

FIG. 2 depicts a plan view of the central plug connection (9). The central plug connection (9) comprises a left-hand latching means (9a), a central part (9b) with an electrically continuous contact element (12), and a right-hand latching means (9c). The right-hand latching means (9c) and left-hand latching means (9a) can be implemented identical or different. The left-hand latching means (9a), the central part (9b), and the right-hand latching means (9c) preferably constitute a component made of metal or polymer. The central plug connection (9) forms part of the spacer (3) or a middle part that can be integrated into the spacer (3), preferably a part of the spacer (3) sealed outwardly and inwardly gas and moisture tight. The left-hand latching means (9a) and the right-hand latching means (9c) enable insertion of the central plug connection (9) into the spacer (3) and are preferably surrounded by an adhesive or a sealant (not shown). The electrical contacting is done via plug contacts (14) inside the contact element (12). The contact element (12) can alternatively consist of a plurality of connected electrical contacts inside the central plug connection (9), which, altogether, enable a continuous electrical connection from inner plug connection (8) to the outer plug connection (10).

FIG. 3 depicts an enlarged plan view of the central plug connection (9). The basic structure consisting of a left-hand latching means (9a), a central part (9b) with an electrically continuous contact element (12), and a right-hand latching means (9c) corresponds to that depicted in FIG. 2. The contact element (12) preferably comprises a projection (11) that is determined by the indicated projection height (26). The projection (11) is preferably arranged in the direction of the outer plug connection (10) (not shown). The projection (11) and/or the central plug connection (9) preferably have a metal surface (27) with an interruption to the electrically used plug contacts (14). This metal surface reduces the loss of gas from the intermediate space between the first pane (1) and the second pane (2) and, at the same time, prevents the penetration of moisture. Bolted connections (22) serve to fix the plug connection arrangement (7) depicted in FIG. 1 consisting of the inner plug connection (8), the central plug connection (9), and the outer plug connection (10). A sealant (28), preferably a butyl rubber or a silane-modified polymer, is applied on the plug connection (9) in the transition between the left-hand latching means (9a) and/or right-hand latching means (9c) and the central part (9b). An adhesive bond (13) and splayed arms/barbed hooks (21) on the left-hand latching means (9a) and right-hand latching means (9c) provide for a secure hold of the central plug connection (9) inside the spacer (3). The adhesive bond (13) is preferably applied (not shown) in the entire region of the left-hand latching means (9a) and right-hand latching means (9c).

FIG. 4 depicts a plan view of the outer plug connection (10). The electrical contacting is accomplished via plug contacts (25). The fastening is preferably accomplished via the bolted connections (22). The outer plug connection (10) preferably has an angled cable feed (16). The angle α, depicted by the dashed lines inside the cut-off cable feed (16), is preferably 10° to 70°, particularly preferably 30° to 60°. The angled cable feed (16) with cable connection (23) enables a space-saving assembly of the outer plug connection (10) and, thus, of the entire insulating glazing according to the invention.

FIG. 5 depicts a flowchart of the method according to the invention. In a first step, an electrical load (15), for example, an LED strip (24), is arranged on a first pane (1) of the subsequent insulating glazing. Next, or previously, a central plug connection (9) is set into a peripheral spacer (3). In the following step, the electrical load (15) is electrically conductively connected via an inner plug connection (8) to the central connection (9). In the next step, the spacer (3) with shielded inner insulation (4) is arranged between the first pane (1) and a second pane (2) and is combined with an outer insulation (5) to form an insulating glazing. Before the application of the outer insulation (5), for example, organic polysulfide, a protective cap is placed on the central plug connection (9) on the outward facing side, preferably on the projection (11). After the curing of the outer insulation (5), the protective cap can be removed. The protective cap prevents gluing or plugging the plug contacts (14) in the central plug connection (9) with parts of the outer insulation (5). Finally, the central plug connection (9) is connected to an outer plug connection (10).

LIST OF REFERENCE CHARACTERS (1) first pane
(2) second pane
(3) spacer
(4) inner insulation
(5) outer insulation
(6) edge space
(7) plug connection arrangement (8, 9, 10)
(8) inner plug connection
(9) central plug connection
(9a) left-hand latching means
(9b) central part
(9c) right-hand latching means
(10) outer plug connection
(11) projection
(12) contact element
(13) adhesive bond
(14) plug contact
(15) electrical load
(16) angled cable feed/outer cable
(17) electrochromic coating
(18) photovoltaic module
(19) photovoltaic coating
(20) cable
(21) splayed arms/barbed hooks
(22) bolted connection
(23) cable connection
(24) LED strip
(25) plug contact (outer plug connection)
(26) projection height
(27) metal surface/metal foil/metal coating
(28) sealant

The invention claimed is:

1. An insulating glazing with an electrical connection element, comprising:
   a first pane and a second pane,
   a peripheral spacer between the first pane and the second pane,
   an inner insulation between the peripheral spacer and the first pane and between the peripheral spacer and the second pane, wherein the spacer is surrounded on a contact surface with the first pane and second pane by the inner insulation,
   an outer insulation in an outer edge space between the first pane, the peripheral spacer, and the second pane, wherein the outer insulation completely fills the outer edge space, and
   a connected plug connection arrangement, wherein the connected plug connection arrangement comprises an inner plug connection between the first pane and the second pane, a central plug connection in the peripheral spacer, and an outer plug connection, wherein
      the central plug connection comprises a left-hand latching means, a central part with an electrically continuous contact element, and a right-hand latching means,
      the electrically continuous contact element produces an electrical connection to the inner plug connection as well as an outer plug connection,
      an LED strip is arranged between the first pane and the second pane, and
      the LED strip is electrically connected to the inner plug connection.

2. The insulating glazing according to claim 1, wherein the electrically continuous contact element has 1 to 12 plug contacts.

3. The insulating glazing according to claim 1, wherein the central plug connection has a length of 60 mm to 200 mm.

4. The insulating glazing according to claim 1, wherein the central plug connection has a width of 8 mm to 20 mm.

5. The insulating glazing according to claim 1, wherein the left-hand latching means and/or the right-hand latching means are surrounded by an adhesive bond.

6. The insulating glazing according to claim 1, wherein the left-hand latching means and/or the right-hand latching means comprise barbed hooks or splayed arms.

7. The insulating glazing according to claim 1, wherein the inner plug connection, the central plug connection, and/or the outer plug connection comprise plugs, jacks, couplings, or sockets.

8. The insulating glazing according to claim 1, wherein the electrically continuous contact element comprises a projection.

9. The insulating glazing according to claim 8, wherein the projection has a depth of 15 mm to 30 mm.

10. The insulating glazing according to claim 1, wherein the outer plug connection has an angled cable feed.

11. The insulating glazing according to claim 1, wherein the first pane and/or the second pane have an electrochromic coating, the electrochromic coating being electrically connected to the inner plug connection.

12. The insulating glazing according to claim 1, wherein the first pane and/or the second pane have a photovoltaic module or a photovoltaic coating, and the photovoltaic module or the photovoltaic coating are electrically connected to the inner plug connection.

13. A method for producing the insulating glazing according to claim 1 comprising:
   arranging an electrical load on the first pane,
   setting the central plug connection in the peripheral spacer,
   connecting the electrical load via an inner plug connection to the central plug connection,
   arranging the peripheral spacer with the inner insulation between the first pane and the second pane and with an outer insulation to form the insulating glazing, and connecting the central plug connection to an outer plug connection.

14. A method comprising:
using the insulating glazing according to claim 1 as illuminated glazing, electrochromic glazing, and/or a photovoltaic module.

15. The insulating glazing according to claim 2, wherein the electrically continuous contact element has 4 to 10 plug contacts.

16. The insulating glazing according to claim 3, wherein the central plug connection has a length of 80 mm to 150 mm.

17. The insulating glazing according to claim 4, wherein the central plug connection has a width of 10 mm to 15 mm.

18. The insulating glazing according to claim 8, wherein the projection is in a direction of the outer plug connection.

* * * * *